United States Patent
Iliasevitch (10) Patent No.: US 6,380,644 B1
(45) Date of Patent: Apr. 30, 2002

(54) SWITCHING CIRCUITRY PROVIDING IMPROVED SIGNAL PERFORMANCE AT HIGH FREQUENCIES AND METHOD OF OPERATION THEREOF

(75) Inventor: Stepan Iliasevitch, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/449,975

(22) Filed: Nov. 26, 1999

(51) Int. Cl.$^7$ .................................................. H03G 3/10
(52) U.S. Cl. ........................ 307/130; 330/285; 327/434
(58) Field of Search .................................. 307/112, 130; 326/26, 27; 327/382, 378, 434, 427; 330/285, 145, 311, 282, 86, 144

(56) References Cited

U.S. PATENT DOCUMENTS

| | | | | |
|---|---|---|---|---|
| 3,325,654 A | * | 6/1967 | Mrazek | 327/427 |
| 3,740,581 A | * | 6/1973 | Pfiffner | 327/377 |
| 4,439,739 A | * | 3/1984 | Kilian et al. | 330/107 |
| 5,091,837 A | * | 2/1992 | Duspiva et al. | 363/15 |
| 5,107,152 A | * | 4/1992 | Jain et al. | 327/431 |
| 5,262,681 A | * | 11/1993 | Takeda | 327/407 |
| 5,519,364 A | * | 5/1996 | Kato et al. | 333/104 |
| 5,883,541 A | * | 3/1999 | Tahara et al. | 327/434 |
| 5,966,051 A | * | 10/1999 | Griffith et al. | 330/285 |
| 6,070,059 A | * | 5/2000 | Kato et al. | 455/78 |
| 6,094,088 A | * | 7/2000 | Yano | 327/534 |
| 6,133,749 A | * | 10/2000 | Hansen et al. | 326/30 |
| 6,215,350 B1 | * | 4/2001 | Wyland | 327/434 |

* cited by examiner

Primary Examiner—Josie Ballato
Assistant Examiner—Roberto Rios (57) ABSTRACT

A switching circuitry and a switching method which reduces the influence of parasitic capacitance and provides improved signal performance at high frequencies. The circuitry may comprise a transistor having a source connected to an input node having an output resistance $R_2$, and a drain is connected to the output node having an input resistance $R_3$. The gate of the transistor is connected to a control node with output resistance $R_{12}$ generating a control signal which opens or closes the transistor. By arranging that $R_1 >> R_2$ (and assuming that $R_1 \geq R_3$), high frequency circuitry characteristics are dramatically improved, and the circuit provides high frequency voltage gain approaching unity and phase shift between the output and input voltages approaching zero to reduce signal degradation. Alternative arrangements may employ bipolar, FET, or MOS transistors or transistor pairs. The switching circuitry has numerous applications, e.g. in power down circuits, video or telephone switches, or any other application where the required frequency of switching may be lower than the transmitted frequency.

29 Claims, 10 Drawing Sheets

PRIOR ART

SWITCHING CIRCUITRY PROVIDING IMPROVED SIGNAL PERFORMANCE AT HIGH FREQUENCIES AND METHOD OF OPERATION THEREOF

FIELD OF INVENTION

The present invention relates to switching circuitry, and in particular, to a transistor switching circuitry providing improved signal performance at high frequencies.

BACKGROUND OF THE INVENTION

Analog or digital switches are employed for connecting two points in signal path to one another. Usually, such switches employ a semiconductor device which is connected between the two points. When the semiconductor device is rendered conductive, it completes a circuit between the two points, and when the device is rendered non-conductive, it opens the circuit between the two points. It is common to use transistors as switches, the most widely used examples including bipolar junction transistor (BJT), field effect transistor (FET), junction FET (JFET), metal-oxide semiconductor FET (MOSFET) and other known types of transistors used in electronic industry.

Figure 1:
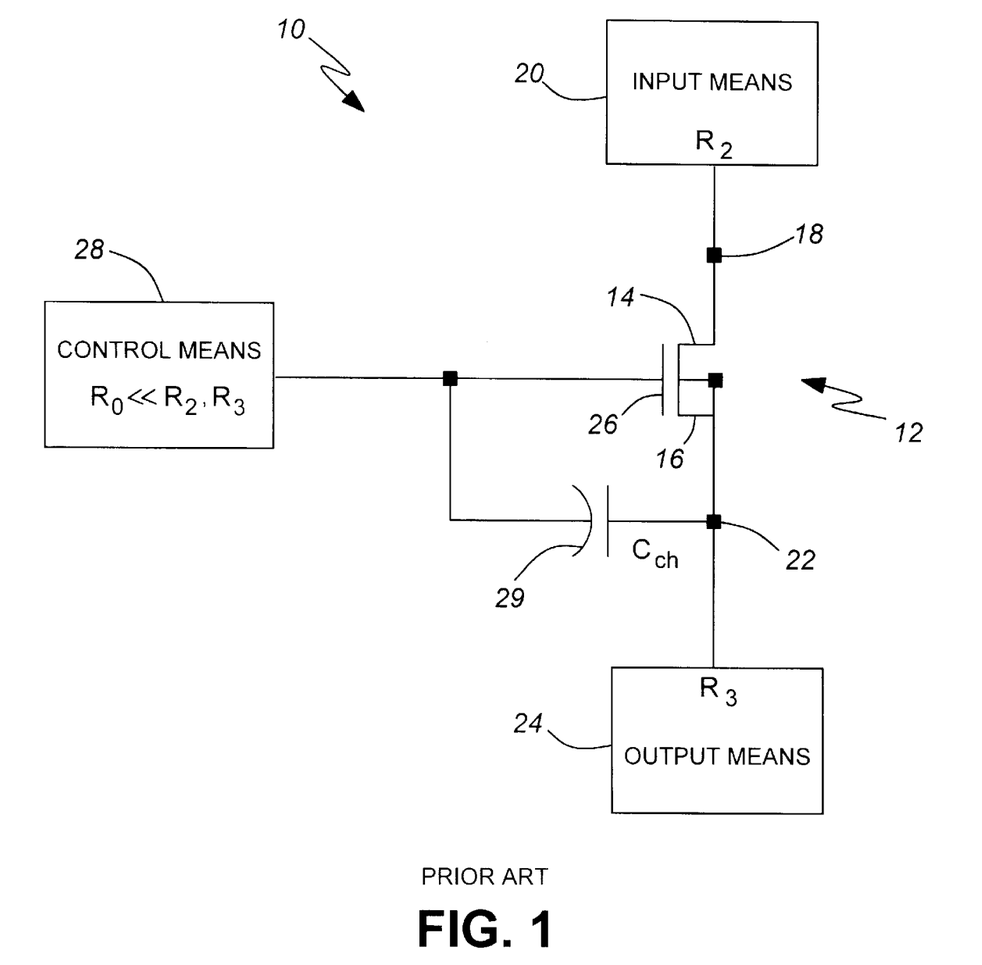
FIG. 1 illustrates a switching circuitry according to the prior art.

A typical example of the prior art switch 10 is shown in FIG. 1. It comprises a switching means represented by an NMOS transistor 12, whose source 14 is connected to an input node 18 of an input means 20, the input node being a first circuitry point, and whose drain 16 is connected to an output node 22 of an output means 24, the output node being a second circuitry point. The input means 20 has an output resistance $R_2$, and the output means 24 has an input resistance $R_3$, usually $R_3$ being much larger than $R_2$. The gate 26 of the transistor 12 is connected to the control means 28 which sends a control signal to the gate 26 to open or close the transistor 12. The control means has an internal resistance $R_0$ which is small compared to the output resistance $R_2$ and the input resistance $R_3$. When the control signal is below a predetermined threshold value, the transistor 12 is cut off and therefore is non-conducting, which means that the input and output nodes 18 and 22 along a signal path are disconnected. Alternatively, when the control signal is above the threshold value, the transistor 12 is conducting, and the two nodes 18 and 22 along the signal path are connected to each other.

There is a drawback associated with the above circuitry. It is known that semiconductor devices have internal distributed resistance and capacitance inherently coupled into the devices due to their internal structure. For example, MOSFET transistors have dominant capacitive effect due to the gate-to-channel capacitance which can be modeled by a single capacitor between the gate and the conducting channel. The corresponding distributed capacitor $C_{ch}$ associated with the internal structure of the transistor 12 is designated by numeral 29 in FIG. 1 (the corresponding distributed resistance $R_{ch}$ of the transistor 12 is not shown). The presence of the distributed capacitor $C_{ch}$ influences the frequency characteristics of the switching circuitry 10. The capacitor $C_{ch}$ and the resistor $R_2$ form a resistor-capacitance circuit $R_2 C_{ch}$ which results in the following transfer function of the switching circuitry 10:

$$T = V_{out}/V_{in} = 1/(1+j\omega C_{ch} R_2) \qquad (1)$$

where $V_{in}$ and $V_{out}$ are input and output voltages at the input and output nodes 18 and 22 respectively, $\omega$ is frequency of the transmitted signal, and $j=\sqrt{-1}$. As follows from equation (1), the RC circuit operates as a low pass filter, and the switching circuitry 10 cuts off high frequency signals starting approximately at $\omega \sim 1/(R_2 C_{ch})$. As a result, the circuitry 10 exhibits substantial signal degradation at high frequencies which is not acceptable in many practical situations.

Accordingly, there is a need in electronic industry for designing alternative switching circuitry which would reduce or eliminate the influence of the parasitic capacitance and provide no or substantially reduced signal degradation at high frequencies.

SUMMARY OF THE INVENTION

It is therefore an object of the invention to provide a switching circuitry which would avoid the afore-mentioned problem.

According to one aspect of the invention there is provided a switching circuitry, comprising:

a semiconductor device having an input node and an output node, the input node being connected to an input means having an output resistance $R_2$, and the output node being connected to an output means having an input resistance $R_3$;

the semiconductor device having a first state where the first node and the second node are substantially electrically connected, and a second state where the nodes are substantially electrically disconnected;

the semiconductor device being responsive to a control signal generated by a control means, having an output resistance $R_1$, to provide switching of the device between the first and the second states;

the switching circuitry being characterized in that the output resistance of the control means $R_1$ is greater than the output resistance of the input means $R_2$ i.e. $R_1 > R_2$, thereby ensuring that switching of an electrical signal is provided so that signal degradation at high frequencies is substantially reduced or eliminated.

Preferably, the control means has the output resistance which is much greater than the output resistance of the input means, i.e. $R_1 >> R_2$. It provides voltage gain and phase shift between the output and input voltages approaching unity and zero respectively at high frequencies, thus ensuring no signal degradation. Usually the output resistance of the control means is of the order of magnitude or greater than the input resistance of the output means, i.e. $R_1 \geq R_3$. Other arrangements when $R_1 >> R_3$ and/or $R_3 >> R_2$ are also possible. Conveniently, the resistance $R_1$ can have a variable magnitude, e.g. being formed as a digitally controlled resistive network to provide digital control of resistance of the resistor $R_1$. It is implied that magnitude of $R_1$ may vary depending on the signal generated by the control means and/or on the state of semiconductor device (conducting or non-conducting). It is beneficial to have resistances $R_1$ and $R_2$ that are matched to provide stability of the circuitry characteristics. It would also be beneficial for the resistance $R_3$ to have a layout matched to the resistances $R_1$ and $R_2$.

Advantageously, the semiconductor device of the switching circuitry comprises a transistor which is selected from the group consisting of BJT transistor, FET transistor, JFET transistor, MOSFET transistor, depletion type MOSFET transistor, enhanced type MOSFET transistor and MESFET transistor. Conveniently, the switching circuitry comprises one of the PMOS and NMOS transistors, where the control means are connected to the gate of the transistor, the source of the transistor being the input node and the drain being the output node. It is also possible to interchange source and gain of the transistor, using them as output and input nodes respectively. Alternatively, the circuitry may comprise the semiconductor device including a first transistor and a second transistor, the transistors having a complimentary structure and arranged so that the source of the first transistor is connected to the drain of the second transistor to form one of the input and output nodes, and the source of the second transistor is connected to the drain of the first transistor to form the other node;

the control means comprising a first output connected to the gate of the first transistor through a first output resistance R,a, and a second output connected to the gate of the second transistor through a second output resistance $R_{1,b}$, the first and second outputs generating complimentary control signals for switching the semiconductor device between the first and second states, and the circuitry being characterized in that $R_{1,a}$, $R_{1,b} > R_2$, and $R_{1,a}$, $R_{1,b} \sim R_3$.

Beneficially, $R_{1,a}, R_{1,b} >> R_2$ and $R_{1,a} R_{1,b} \geq R_3$. Alternatively, instead of one control means having two complimentary outputs, the control means may comprise a first control means and a second control means generating complimentary signals.

Though control means output resistance $R_1$ may be formed by means of a resistor, various modifications are also possible. For example, the control means output resistance may be formed by means of an output resistance of a long channel inverter, by means of a resistor and a long channel inverter coupled in series and/or by means of a known semiconductor device having a resistance.

The switching circuitry described above has numerous applications, e.g. in a power down circuit, input/output amplifier, input/output pad, telephone switch and video switch, being capable of switching signals whose transmittance frequency is higher than the frequency of switching. Depending on the application being used, the switching circuitry is capable of switching digital or analog signals.

According to another aspect of the invention there is provided a method of connecting/disconnecting a first and second circuitry points along a signal path, comprising the steps of:

generating an electrical signal by an input means having an input node and characterized by an output resistance $R_2$, the input node being the first circuitry point;

the signal to be received by an output means having the output node and characterized by an input resistance $R_3$, the output node being the second circuitry point;

transmitting the signal through a switching means disposed between the first and second circuitry points, the switching means having a first state where the circuitry points are substantially electrically connected, and a second state where the circuitry points are substantially electrically disconnected, the switching means being responsive to a control signal generated by a control means having an output resistance $R_1$;

arranging that $R_1 > R_2$, thereby ensuring that connection and disconnection of the first and second circuitry points takes place without substantial signal degradation at high frequencies.

By arranging $R_1 >> R_2$ (and conveniently using $R_1 \geq R_3$) it is provided that the voltage gain of the circuitry approaches unity while phase shift between output and input voltages tends to zero, thus ensuring high quality circuitry characteristics. Conveniently, it may be arranged that $R_1 >> R_3$ and/or $R_3 >> R_2$. The method suitable for operation with digital signals. It also can be used for operation with analog signals.

According to yet another aspect of the invention there is provided a method of controlling voltage gain and phase shift for a high frequency electrical signal passing through a switching circuitry, comprising the steps of:

generating an electrical signal by an input means having the input node and characterized by an output resistance $R_2$. the signal to be received by an output means having the output node and characterized by an input resistance $R_3$;

transmitting the signal through a switching means disposed between the input node and the output node along a signal path, the switching means having a first state where the nodes are substantially electrically connected, and a second state where the nodes are substantially electrically disconnected, the switching means being responsive to a control signal generated by a control means having an output resistance $R_1$;

varying the ratio of $R_2/R_1$ to provide predetermined signal characteristics at high frequencies, whereby the lower the ratio, the higher the voltage gain and the smaller phase shift between output and input voltages resulting in the lower deterioration of the signal.

Conveniently, it is arranged that $R_1 \geq R_3$ or $R_1 >> R_3$ and/or $R_3 >> R_2$. Similar to the above, the method is suitable for operation with digital and analog signals.

Thus, the switching circuitry of the invention provides connecting/disconnecting of two nodes of the circuitry along the signal path in such a manner that the influence of the parasitic capacitance of the semiconductor device is reduced, which results in substantially reduced or completely eliminated signal degradation at high frequencies. The operation of the circuitry also provides a method of connecting/disconnecting two circuitry points along a signal path ensuring reduced or eliminated signal degradation at high frequencies. Additionally, it provides a convenient method of controlling high frequency voltage gain and phase shift of an electrical signal passing through a switching circuitry by varying the ratio of the output resistance of the input means over the output resistance of the control means, i.e. by varying $R_2/R_1$.

BRIEF DESCRIPTION OF THE DRAWINGS

Embodiments of the invention will now be described, by way of example, with reference to the accompanying drawings in which:

FIGS. 3 to 12 illustrate switching circuitry according to second to eleventh embodiments of the invention respectively.

DESCRIPTION OF THE PREFERRED EMBODIMENTS

Figure 2:
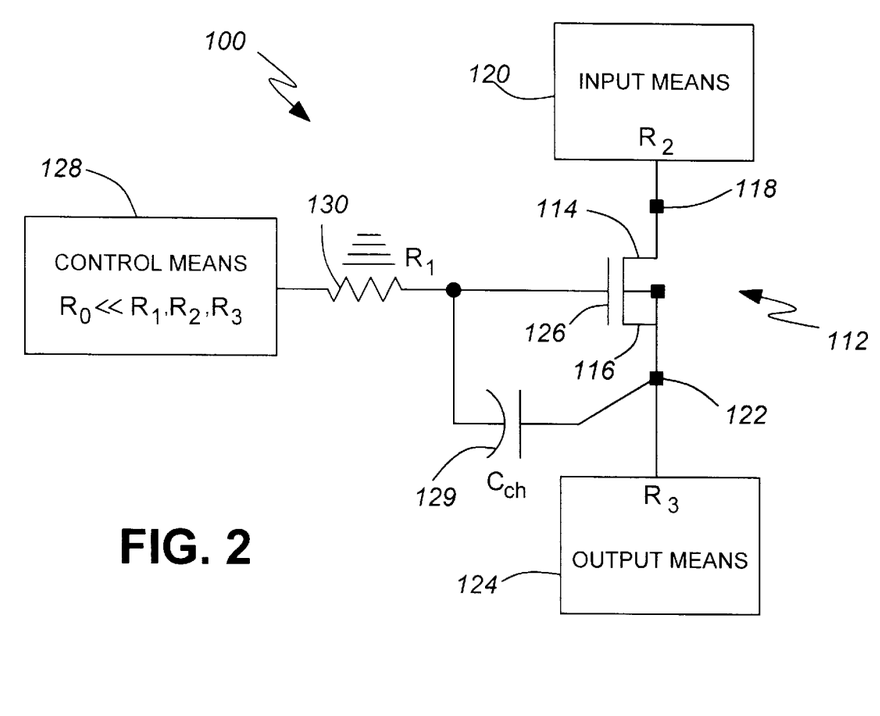
FIG. 2 illustrates a switching circuitry according to a first embodiment of the invention.

A switching circuitry 100 according to the first embodiment of the invention is shown in FIG. 2. It is similar to that shown in FIG. 1, and like elements are referred to by same reference numerals incremented by 100, for example, transistor 112 whose source and drain are connected between input and output means 120 and 124 respectively, and whose gate is connected to the control means 128. The circuitry 100 of the first embodiment differs from the circuitry 10 of FIG. 1 in that an additional control means output resistor 130, having resistance $R_1$, is introduced between the control means 128 and the gate 126. It is arranged that the magnitude of $R_1$ is much greater than $R_2$ and of the order of $R_3$ (or greater), i.e. the output impedance of the control means is now not negligibly small compared to the impedance $R_2$ and $R_3$ of the input and output means respectively as it is arranged in the prior art.

Introduction of an additional control means output resistor $R_1$ results in a dramatic improvement of the circuitry characteristics. To demonstrate it, below are the calculations of the transfer function of the switching circuitry 100, derived in an assumption that $R_3 >> R_2, R_1$ (where the assumption is made for the simplicity of derivations only).

The transfer function of the circuitry 100 defined as $T = V_{out}/V_{in}$ is as follows:

$$T = \frac{V_{out}}{V_{in}} = \frac{\frac{1}{j\omega C_{ch}} + R_1}{\frac{1}{jwC_{ch}} + R_1 + R_2} = \frac{1 + j\omega R_1 C_{ch}}{1 + j\omega (R_1 + R_2) C_{ch}} \quad (2)$$

$$= \frac{(1 + j\omega R_1 C_{ch})(1 - j\omega (R_1 + R_2) C_{ch})}{1 + \omega^2 (R_1 + R_2)^2 C_{ch}^2}$$

$$= \frac{1 + \omega^2 C_{ch}^2 R_1 (R_1 + R_2) - j\omega C_{ch} R_2}{1 + \omega^2 (R_1 + R_2)^2 C_{ch}^2}$$

Accordingly, gain G of the circuitry, defied as an absolute value of the transfer function T, and a phase shift $\phi$ between the output and input voltages are expressed as follows:

$$G = \left|\frac{V_{out}}{V_{in}}\right| = \frac{\sqrt{(1 + \omega^2 C_{ch}^2 R_1 (R_1 + R_2))^2 + \omega^2 C_{ch}^2 R_2^2}}{1 + \omega^2 (R_1 + R_2)^2 C_{ch}^2} \quad (3)$$

$$tg\varphi = \frac{\omega C_{ch} R_2}{1 + \omega^2 C_{ch}^2 R_1 (R_1 + R_2)} \quad (4)$$

Accordingly, at high frequencies, when $\omega \to \infty$, $$G \approx \frac{R_1}{R_2 + R_1} = \frac{1}{1 + \frac{R_2}{R_1}}, \quad (5)$$

and $$\phi \to 0. \quad (6)$$

From equations (5) and (6) it follows that when $R_1 >> R_2$, then $G \to 1$ and $\phi \to 0$, which corresponds to a perfect transfer function of the circuitry 100. Generally, when $R_3$ is comparable in magnitude to $R_1$, equations (3) to (6) are valid provided that $R_1$ is substituted with $R_1 R_3/(R_1 + R_3)$, which corresponds to the resistances $R_1$ and $R_3$ connected in parallel.

By way of example, the switching circuitry 100 described above has been implemented with the following components: $R_2=1$ kOhms, $R_3=100$ kOhms, $R_1$ ranging from 1 Ohms to 10 kOhms, and transistor 112 having a width of w=80 micron and length of l=0.35 micron. The input and output means may have included an input and output stage amplifiers respectively (not shown in detail in Figures).

FIGS. 3 to 12 illustrate alternative embodiments of the invention. For convenience, like elements are referred to by same reference numerals incremented by 100 for each consecutive embodiment.

Figure 3:
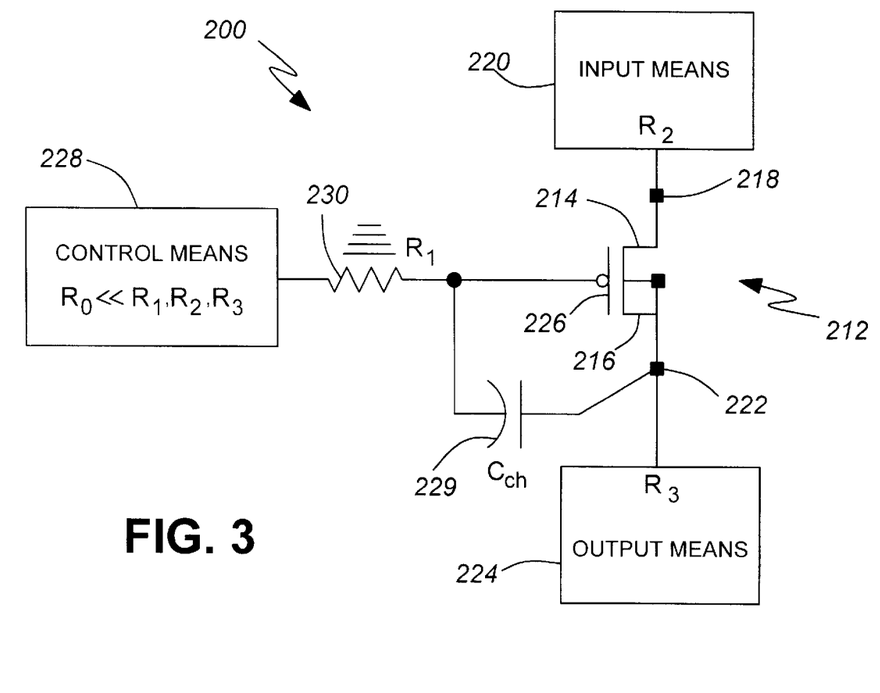

A switching circuitry 200 of a second embodiment, shown in FIG. 3, is similar to that of the first embodiment of FIG. 2 except for the NMOS transistor 112 being replaced with a PMOS transistor 212.

Figure 4:
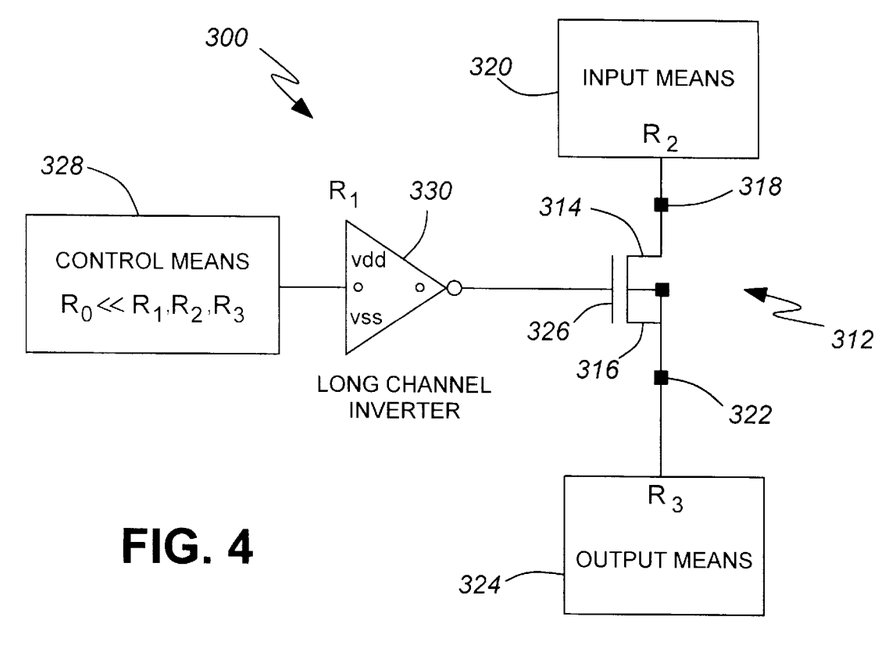
Figure 5:
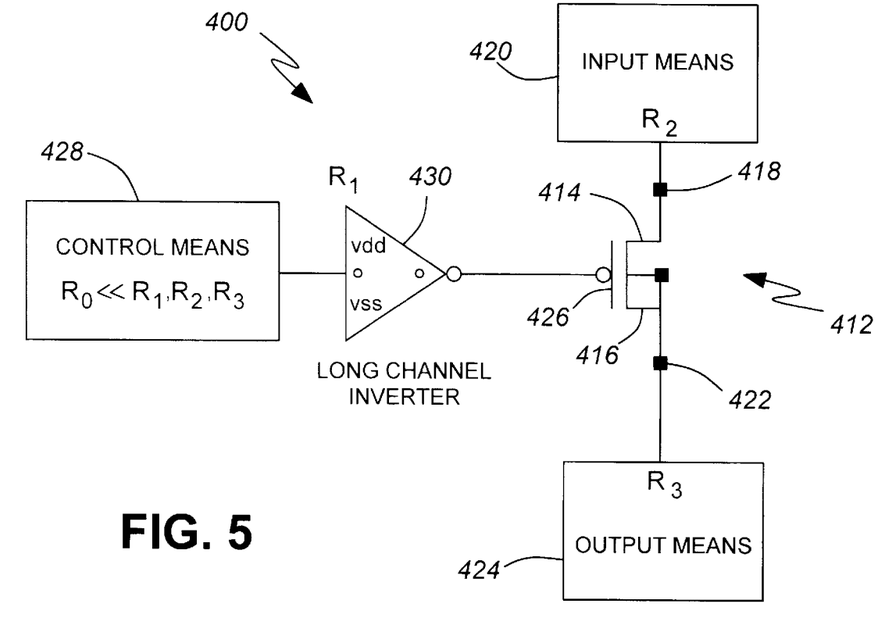

Switching circuitry 300 and 400 of third and fourth embodiments, shown in FIGS. 4 and 5 respectively, are similar to that of the first and second embodiments described above except for the control means output resistors 130 and 230 being replaced with long channel inverters 330 and 430 respectively. Accordingly, the output resistances of the inverters are used as the output resistances $R_1$ of the corresponding control means.

Figure 6:
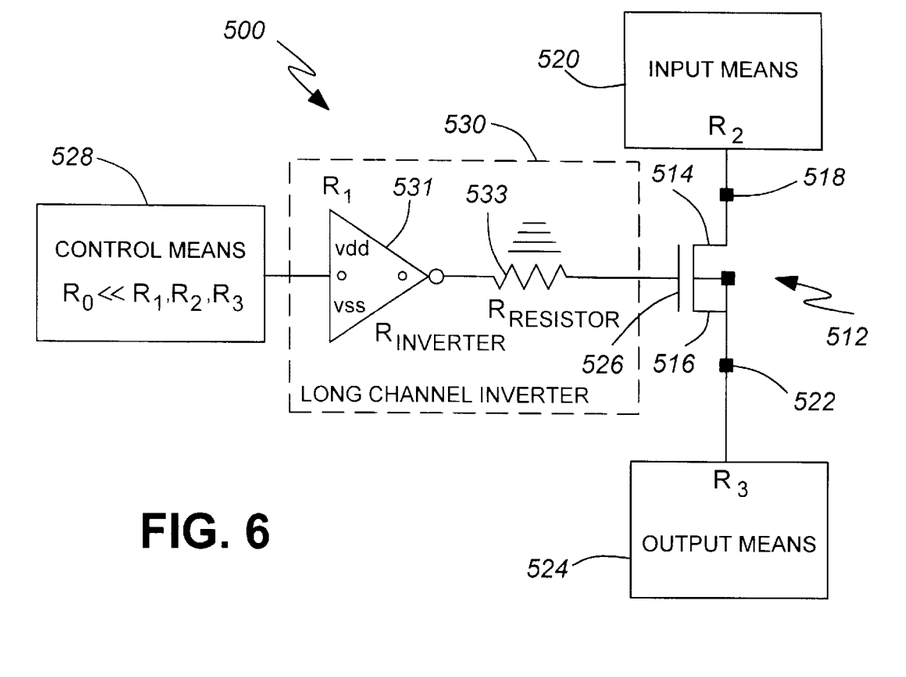

A circuitry 500 of a fifth embodiment, shown in FIG. 6, is similar to that of the first and second embodiments. The difference is how the control means output resistance 530 ($R_1$) is formed. In this embodiment the resistor 530 is formed by a long channel inverter 531 and a resistor 533 connected in series, i.e. $R_1 = R_{inverter} + R_{resistor}$. It is also assumed that $R_1 >> R_2$ and $R_1 \geq R_3$ as discussed above.

Figure 7:
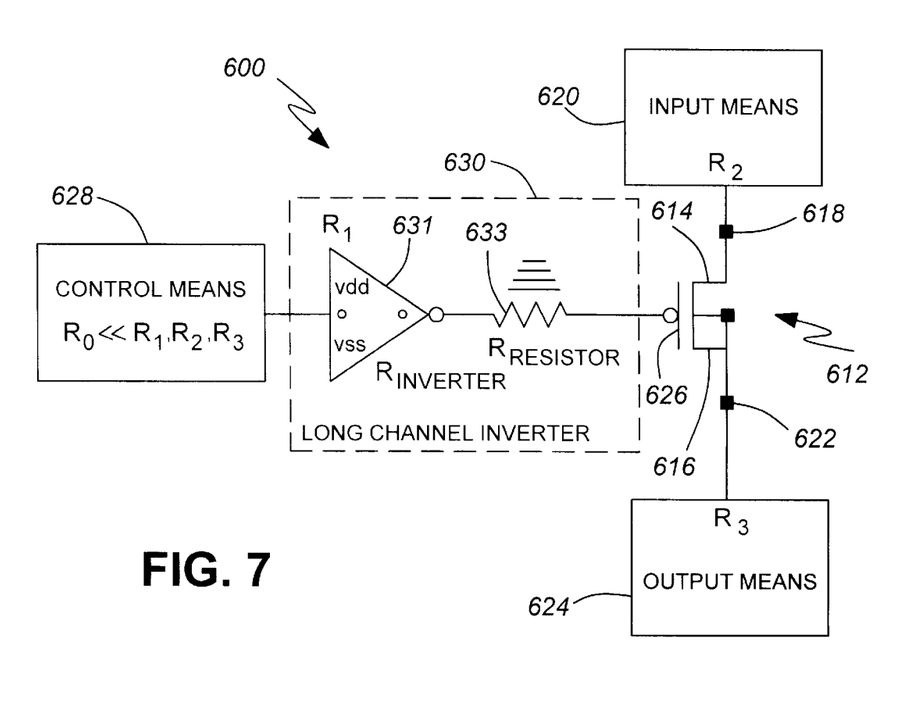

A circuitry 600 of a sixth embodiment repeats the circuitry 500 of the fifth embodiment, being different in that the NMOS transistor 512 is substituted by a PMOS transistor 612, as shown in FIG. 7.

Figure 8:
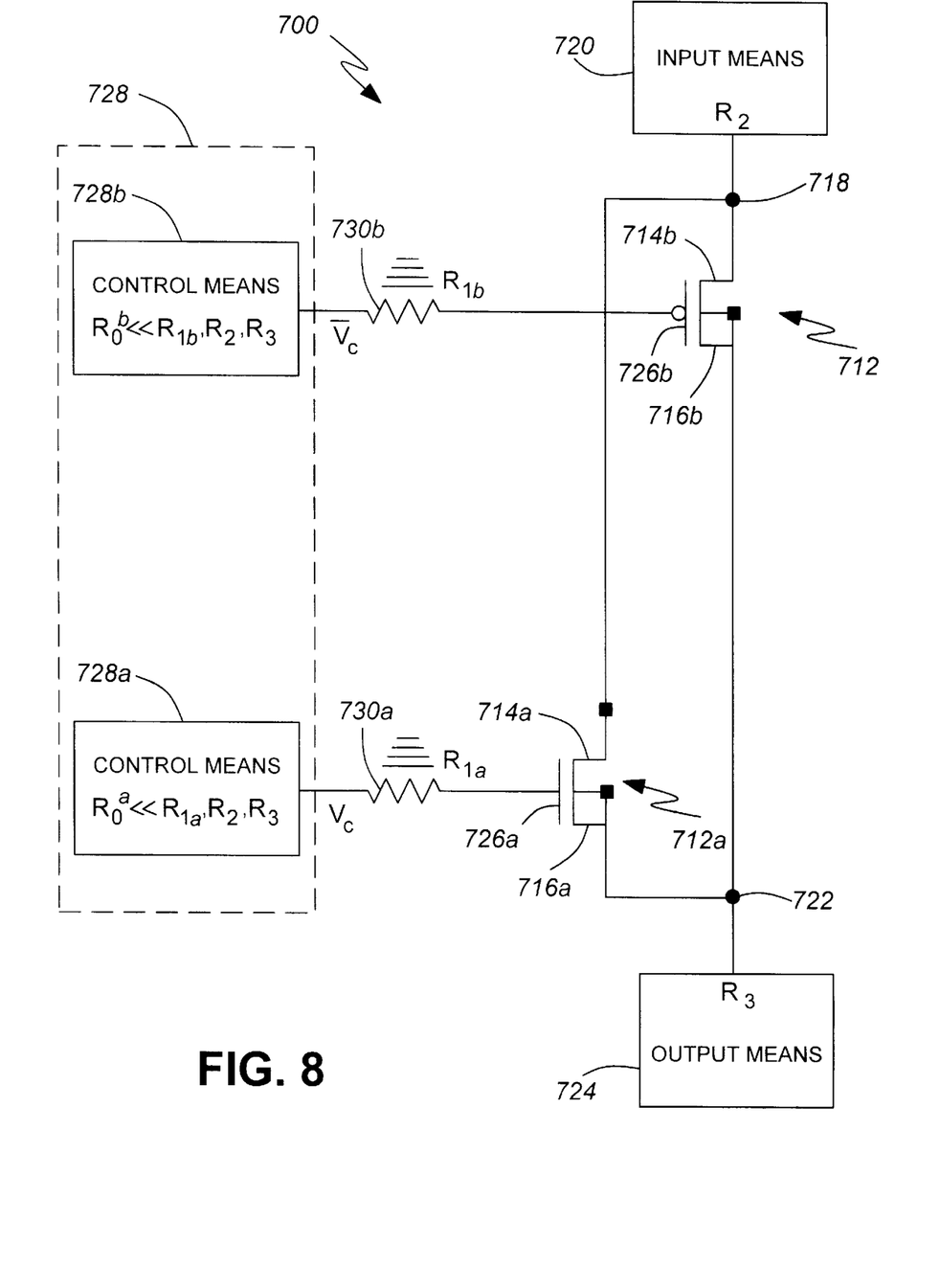

A circuitry 700 of a seventh embodiment, shown in FIG. 8, is commonly known as a transmission gate. It includes a NMOS transistor 712a and a PMOS transistor 712b arranged so that the drain of one transistor is connected to the source of the other, and vice versa. The transistor gates 726a and 726b are controlled by two complimentary signals generated by corresponding first and second control means 728a and 728b, the signals being denoted $V_C$ and $\overline{V}_c$ complimentary respectively. When $V_c$ is at the low level, the gate 726a of the NMOS transistor 712a will be at the low level, thus preventing the NMOS transistor 712a from conducting. Simultaneously, the gate 726b of the PMOS transistor 712b will be at the high level voltage $\overline{V}_c$, which also prevents that transistor from conducting. Thus, with $V_c$ low, the input and output nodes 718 and 722 of the switching circuitry 700 are disconnected. In order to connect the nodes, we have to raise the control signal $V_c$ to the high level. Correspondingly, the NMOS transistor 712a will have its gate at $V_c$ high level and will thus be conducting. Simultaneously, the PMOS transistor 712b will have its gate at $\overline{V}_c$ low level and will also be conducting. Thus, with $V_c$ high, the input and output nodes 718 and 722 of the switching circuitry 700 are connected. Similar to the embodiments described above, the control means 728a is connected to the gate 726a of the transistor 712a through the additional resistor 730a, as shown in FIG. 8. Accordingly, the control means 728b is connected to the gate 726b of the transistor 712b through the additional resistor 730b. The resistors 730a and 730b have resistances $R_{1a}$ and $R_{1b}$ respectively, where $R_{1a}, R_{1b} >> R_2$ and $R_{1a}, R_{1b} \geq R_3$. Instead of two control means 728a and 728b shown in FIG. 8, it is also possible to have one control means 728 (outlined in FIG. 8 by a dashed line) having two outputs which generate complimentary signals $V_c$ and $\overline{V}_c$.

Figure 9:
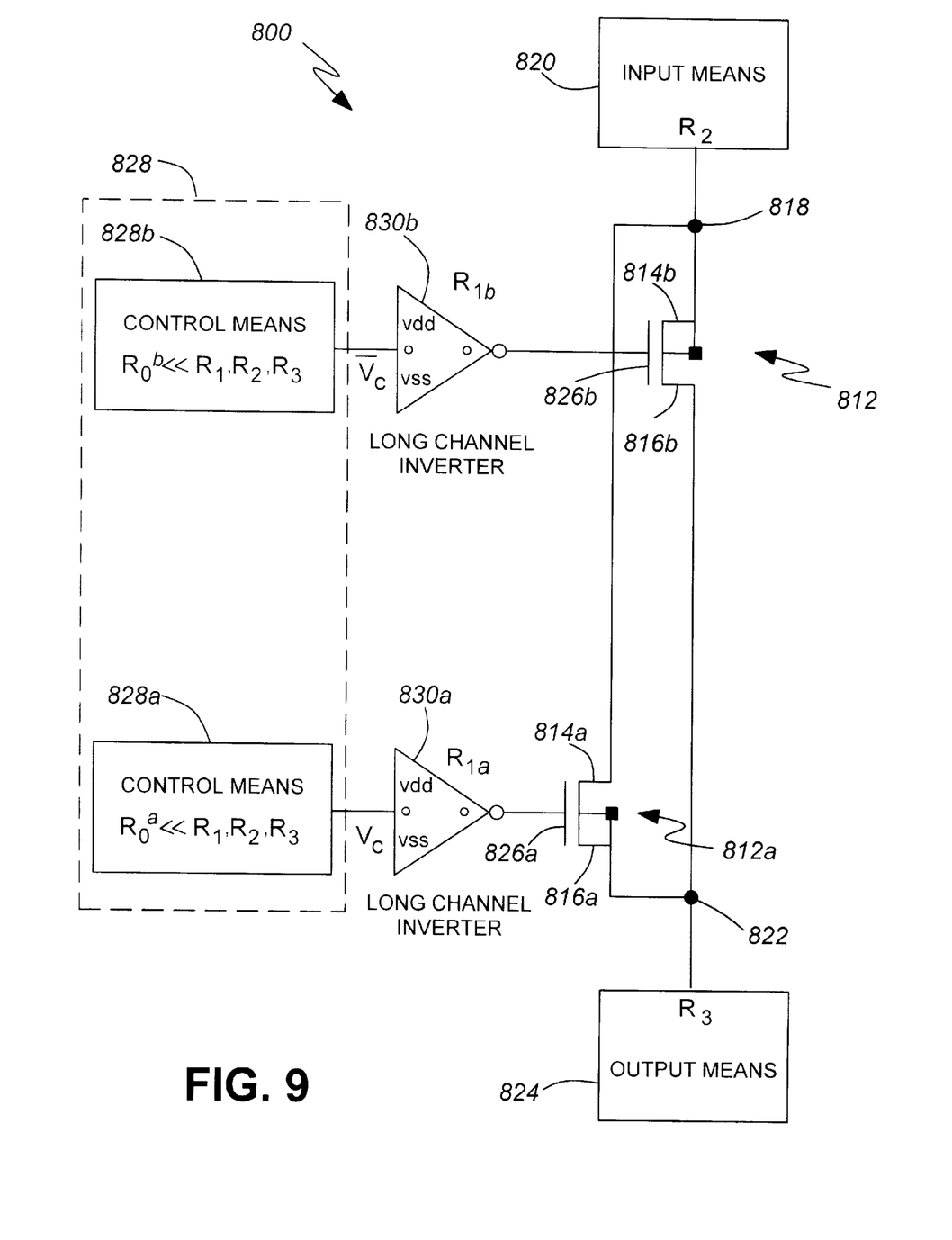

A switching circuitry 800 of an eight embodiment repeats the circuitry 700 of the seventh embodiment except for the control means output resistors 730a and 730b being substituted with the corresponding long channel inverters 830a and 830b as illustrated in FIG. 9. The inverters 830a and 830b have output resistances $R_{1a}$ and $R_{1b}$ respectively, which satisfy the conditions of $R_{1a}, R_{1b} >> R_2$ and $R_{1a}, R_{1b} \geq R_3$ similar to the above. As discussed with regard to the seventh embodiment, it is also possible replace two control means 828a and 828b by a single control means 828, outlined in FIG. 9 by a dashed line, which has two complimentary outputs.

Figure 10:
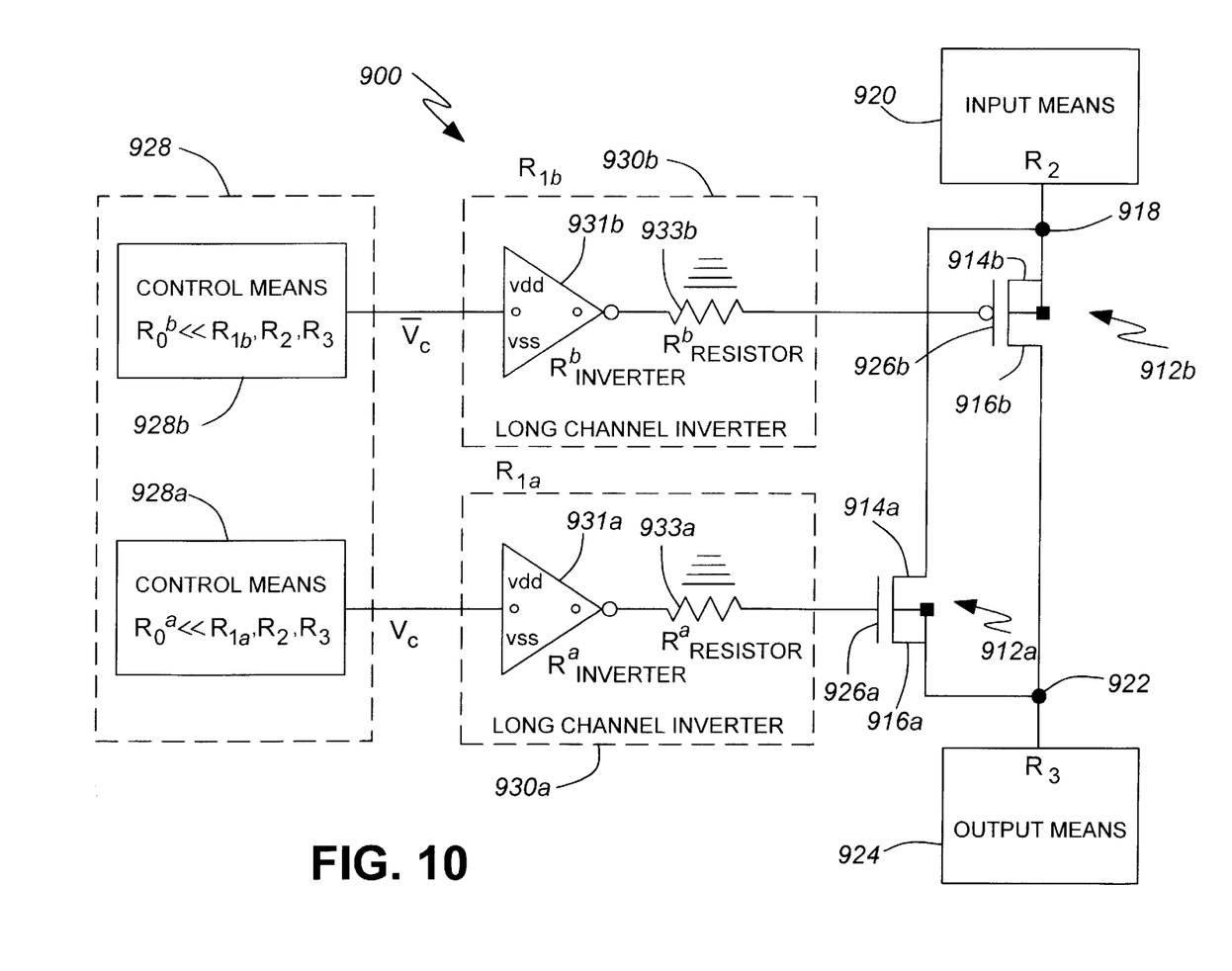

A switching circuitry 900 of a ninth embodiment, shown in FIG. 10, differs from the circuitry 700 and 800 in that each of the control means output resistors is now formed of two elements connected in series. For example, the control means output resistor 930a, having resistance $R_{1a}$, is formed by an inverter 931a and a resistor 933a, having resistances $R^{(a)}_{inverter}$ and $R^{(a)}_{resistor}$ respectively, i.e. $R_{1a}=R^{(a)}_{inverter}+R^{(a)}_{resistor}$. Similarly, the control means output resistor 930b, having resistance $R_{1b}$, is formed by an inverter 931b and a resistor 933b, having resistances $R^{(b)}_{inverter}$ and $R^{(b)}_{resistor}$ respectively, i.e. $R_{1b}=R^{(b)}_{inverter}+R^{(b)}_{resistor}$. It is assumed that $R_{1a},R_{1b}>>R_2$ and $R_{1a},R_{1b}\geq R_3$ similar to other embodiments. It is also assumed that either two control means 928a and 928b or a single control means 928 generating two complimentary signals can be used.

Figure 11:
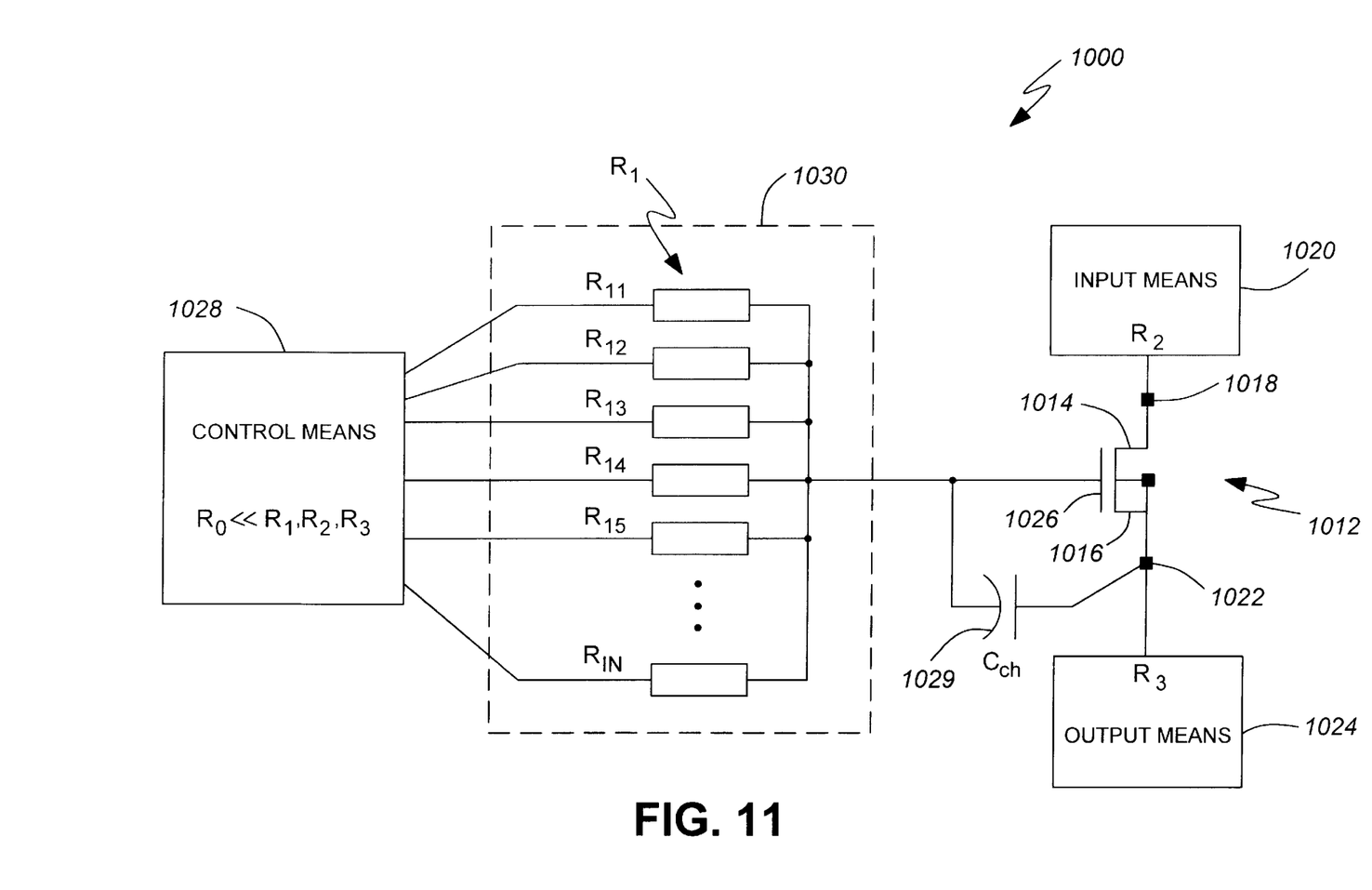

A switching circuitry 1000 of a tenth embodiment of the invention is shown in FIG. 11. It includes a control means output resistance 1030 ($R_1$) which has a variable magnitude as a function of the control means output signal. By way of example, the resistance $R_1$ shown in FIG. 11 comprises a resistive network having N resistors $R_{11}, R_{12}, R_{13}, \ldots R_{1N}$. Assuming that the above resistors are controlled by digital signals, generated by the control means 1028, it is possible to vary the magnitude of the composed resistor $R_1$ in accordance with the digital signal by using a predetermined combination of the resistors. For example, depending on the control means signal, it is possible to arrange that only one of N resistors is being used, or alternatively, that any predetermined number of resistors is being used or combination thereof.

Figure 12:
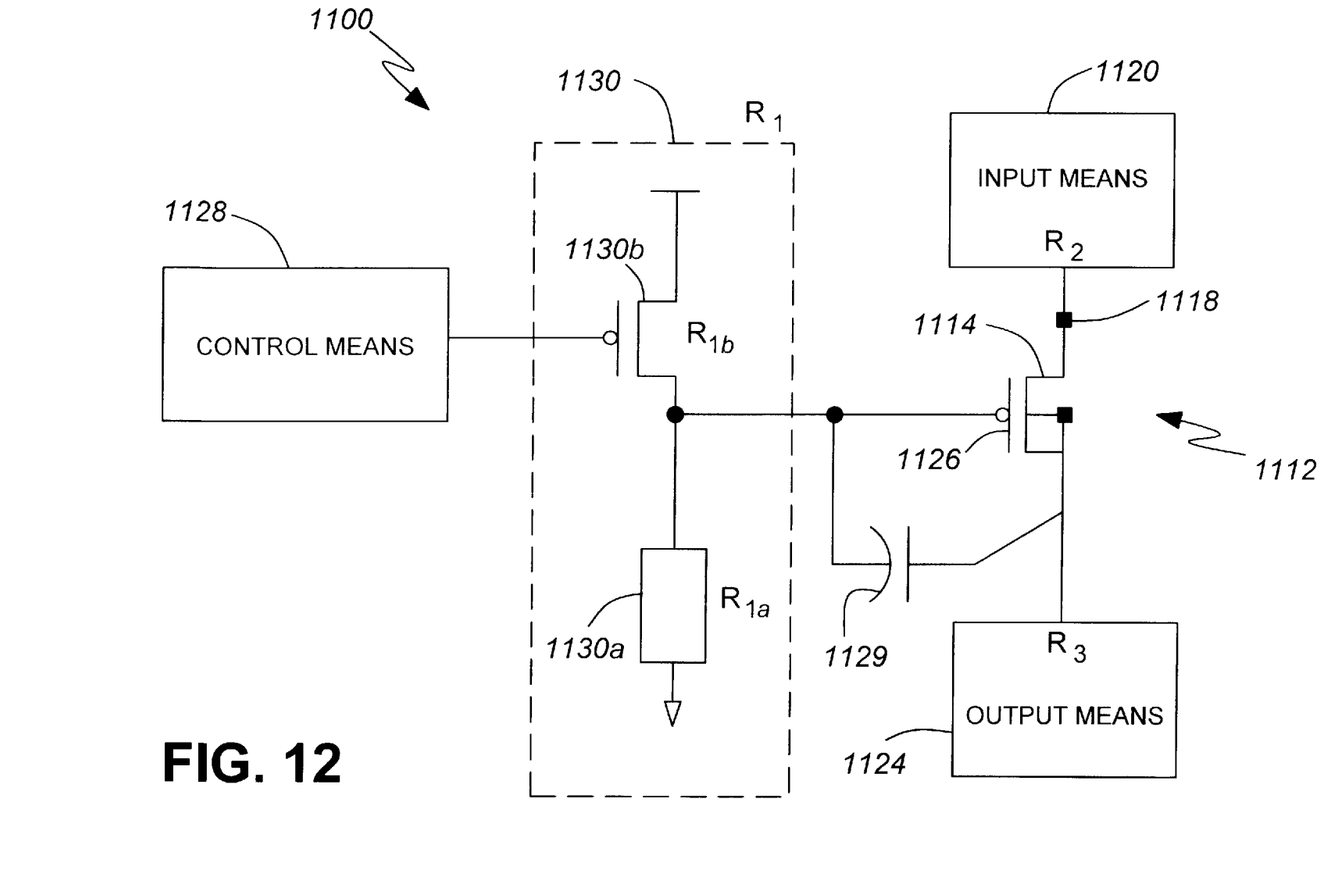

The eleventh embodiment of the invention, having designations similar to other embodiments and shown in FIG. 12, illustrates an implementation of the switching circuitry 1100 having a variable resistor $R_1$ designated by reference numeral 1130. The resistor 1130 is formed by a parallel connection of a resistor 1130a having resistance $R_{1a}$ and a MOS transistor 1130b whose drain to source path resistance is $R_{1b}$. When the MOS transistor 1130b is conducting, the resistance $R_{1b}$ is low, and the switch 1100 is closed. When the MOS transistor 1130b is not conducting, $R_{1b}$ is high, and $R_1 \sim R_{1a}$. Thus, the magnitude of $R_1$ is changes depending on the state of the transistor 1130b.

Alternatively, for the embodiments described above, $R_1$ may comprise a combination of resistors or any other combination of known semiconductor devices having resistive characteristics.

It is worth mentioning that for all the above embodiments the resistance $R_1$ also changes its magnitude depending on the state of the transistor, i.e. when the transistor is in its conducting state $R_1$ is greater, and when the transistor is non-conducting, $R_1$ is smaller.

Although the above preferred embodiments have been described for $R_1>>R_2$, it is also contemplated that alternative embodiments may also be implemented with $R_1>R_2$.

While the embodiments of the invention have been implemented by use of PMOS and NMOS transistors, it is also contemplated that other types of transistors known in electronic industry, e.g. BJT, FET, JFET, depletion type MOSFET, MESFET, may also be used in alternative embodiments. Additional modifications include substitution of the transistor with another known semiconductor device capable of operating as a switch. While in the embodiments described above the output resistors of the control means have been implemented by use of resistors and long channel inverters, it is also contemplated that in the alternative embodiments they may be formed by use of other known semiconductor elements, or a combination thereof.

It is also important to ensure that resistances $R_1$ and $R_2$ (or alternatively $R_1$, $R_2$ and $R_3$) are matched, e.g. manufactured by the same technology by using same materials and having same shape, size and orientation, located in close vicinity, to provide similar characteristics.

It is implied that all the improvements to the circuitry characteristics described above relate to the switching circuitry being in its conducting state, while circuitry characteristics in non-conducting state remain unchanged. The embodiments on the invention allow to diminish parasitic effects not only due to the gate to channel capacitance as mentioned above, but also due to the channel to substrate capacitance which produces parasitic effects in a similar manner.

Figure 13A:
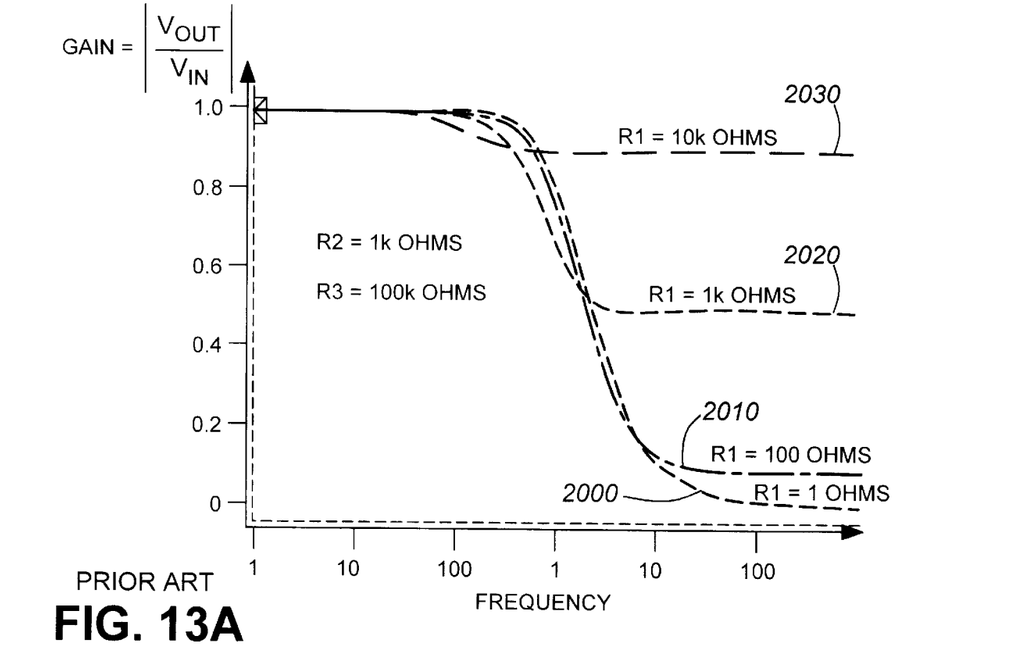
FIGS. 13a and 13b illustrate frequency dependence of voltage gain and phase shift respectively for the switching circuitry of FIGS. 1 and 2.
Figure 13B:
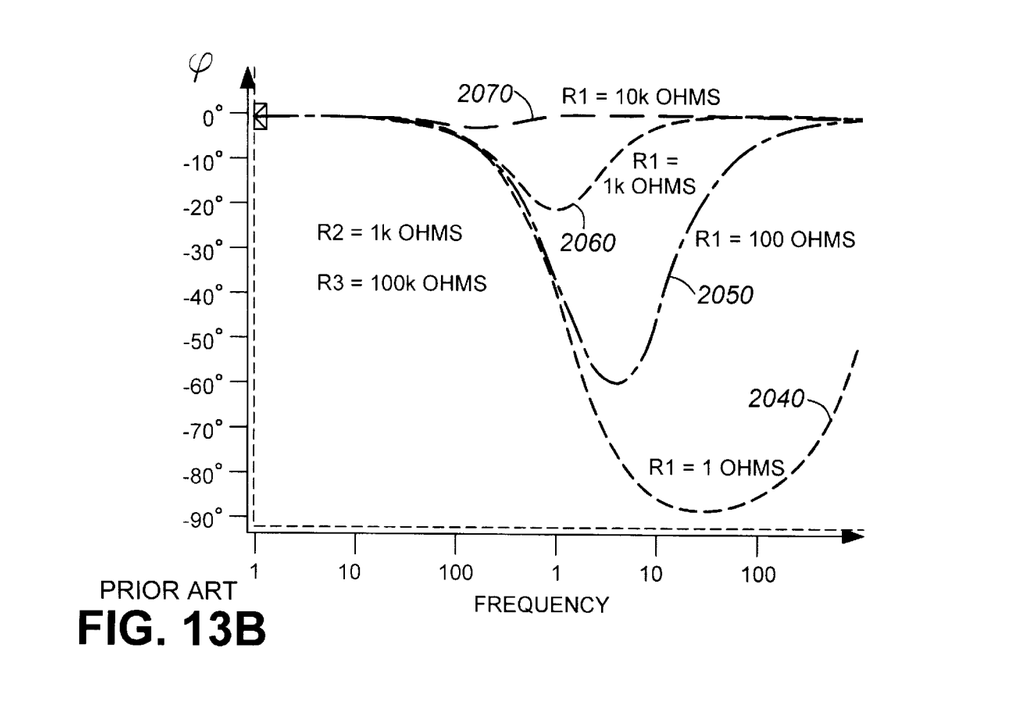

Principles of operation of the switching circuitry will be illustrated on the circuitry 100 of the first embodiment. FIGS. 13a and 13b illustrate frequency dependence for voltage gain and phase shift of the circuitry 100 calculated in accordance with equations (3) and (4) respectively for different values of $R_1$. Curves 2000, 2010, 2020 and 2030 for gain response in FIG. 13a correspond to curves 2040, 2050, 2060 and 2070 for phase shift response in FIG. 13b and are respectively calculated for the following values of $R_1$:$R_1$=1 Ohm, $R_1$=100 Ohms, $R_1$=1 kOhm, $R_1$=10 kOhms. Values of $R_2$ and $R_3$ are set constant and equal to $R_2$=1 kOhm and $R_3$=100 kohms respectively. Virtually, curves 2000 and 2040 represent the prior art results.

As follows from FIG. 13, the lower the ratio of $R_2/R_1$, the closer the voltage gain to its maximal value of unity (FIG. 13a, curve 2030) and the smaller the phase shift between the output and input voltages approaching zero (FIG. 13b, curve 2070). It provides a convenient method of obtaining a predetermined circuitry characteristics (voltage gain and phase shift) and avoiding signal degradation at high frequencies. When G→1 and φ→0 the circuitry 100 provides high quality switching without signal distortion.

Operation of circuitry 200 to 1100 of other embodiments is similar to that of the first embodiment and provides same advantages.

Thus, the switching circuitry of the invention provides connecting/disconnecting of two nodes of the circuitry along the signal path in such a manner that the influence of the parasitic gate-to-channel capacitance of the semiconductor device is reduced, which results in substantially reduced or completely eliminated signal degradation at high frequencies. The operation of the circuitry also provides a method of connecting/disconnecting two circuitry points along the signal path ensuring high quality of the signal at high frequencies. Additionally, it provides a convenient method of controlling high frequency voltage gain and phase shift of the electrical signal passing through the switching circuitry by varying the ratio of the output resistance of the input means over the output resistance of the control means over, i.e. by varying $R_2/R_1$.

The switching circuitry of the invention is suitable for operation with digital and analog signals, which provides numerous applications. For example, the circuitry may be used in power down circuits, video or telephone switches, input/output amplifiers and pads, or any other application where the required frequency of switching is lower than the transmitted frequency.

The switching circuitry of the invention and methods of operation thereof provide many advantages. It ensures high quality signal switching without gain deterioration and phase shift between the output and input voltages. Having zero phase shift is extremely important for phase lock loops, clock recovery circuits or any other application including phase shift sensitive circuitry.

When the resistances $R_1$, $R_2$ (and $R_3$) are matched, the circuitry has more stable gain characteristics, being less dependent on external conditions. Moreover, it makes the stability requirements for the internal control means resistance much less stringent in view of the circuitry characteristics being mainly determined by the resistances $R_1$, $R_2$, $R_3$.

Introduction of the resistance $R_1$ also allows to reduce the complexity of the input means. In the prior art, without introduction of $R_1$, there were stringent requirements for $R_2$ to keep it as low as possible in order to have small values for $R_2 C_{ch}$ chain time constant. For the circuitry of the invention it is not critical any more as follows from equations (3) and (5). As a result, the requirement for low values of $R_2$ is eliminated, and the complexity of the input means is reduced by having smaller chip area and lower power consumption.

Thus, it will be appreciated that, while specific embodiments of the invention are described in detail above, numerous variations, combinations and modifications of these embodiments fall within the scope of the invention as defined in the following claims.

What is claimed is:

1. A switching circuitry, comprising:
   a semiconductor device having an input node and an output node, the input node being connected to an input means having an output resistance $R_2$, and the output node being connected to an output means having an input resistance $R_3$;
   the semiconductor device having a first state where the first node and the second node are substantially electrically connected, and a second state where the nodes are substantially electrically disconnected;
   the semiconductor device being responsive to a control signal generated by a control means, having an output resistance $R_1$, to provide switching of the device between the first and the second states;
   the switching circuitry being characterized in that $R_1 >> R_2$ and $R_1 \geq R_3$, thus providing that voltage gain of the circuitry approaches unity and phase shift between output and input voltages approaches zero.

2. A circuitry as defined in claim 1, wherein $R_1 >> R_3$.

3. A circuitry as defined in claim 2, wherein $R_3 >> R_2$.

4. A circuitry as defined in claim 1, wherein the semiconductor device comprises a transistor.

5. A circuitry as defined in claim 4, wherein the transistor is selected from the group consisting of BJT transistor, FET transistor, JFET transistor, MOSFET transistor, depletion type MOSFET transistor, enhanced type MOSFET transistor and MESFET transistor.

6. A circuitry as defined in claim 4, wherein the transistor is one of the PMOS and NMOS transistors.

7. A circuitry as defined in claim 6, wherein the control means is connected to the gate of the transistor, the source of the transistor being the input node and the drain being the output node.

8. A circuitry as defined in claim 1, wherein the semiconductor device comprises a first transistor and a second transistor, the transistors having a complimentary structure and arranged so that the source of the first transistor is connected to the drain of the second transistor to form one of the input and output nodes, and the source of the second transistor is connected to the drain of the first transistor to form the other node;
   the control means comprising a first output connected to the gate of the first transistor through a first output resistance $R_{1a}$, and a second output connected to the gate of the second transistor through a second output resistance $R_{1b}$, the first and second outputs generating complimentary control signals for switching the semiconductor device between the first and second states, the circuitry being characterized in that $R_{1a}$, $R_{1b} >> R_2$ and $R_{1a}$, $R_{1b} \geq R_3$.

9. A circuitry as defined in claim 1, wherein the resistance $R_1$ is variable.

10. A circuitry as defined in claim 9, wherein the resistance $R_1$ is variable as a function of the control means output signal.

11. A circuitry as defined in claim 10, wherein $R_1$ comprises a resistive network.

12. A circuitry as defined in claim 1, wherein the control means output resistance comprises a resistor.

13. A circuitry as defined in claim 1, wherein the control means output resistance comprises an output resistance of a long channel inverter.

14. A circuitry as defined in claim 1, wherein the control means output resistance comprises a resistor and a long channel inverter coupled in series.

15. A circuitry as defined in claim 1, wherein the control means output resistance comprises a semiconductor device having a resistance.

16. A circuitry as defined in claim 1 for use in a device selected from the group consisting of a power down circuit, input/output amplifier, input/output pad, telephone switch and video switch.

17. A circuitry as defined in claim 1, capable of switching digital signals.

18. A circuitry as defined in claim 1, capable of switching analog signals.

19. A circuitry as defined in claim 1, capable of switching signals whose transmittance frequency is higher than the frequency of switching.

20. A circuitry as defined in claim 1, wherein the resistances $R_1$ and $R_2$ are matched.

21. A circuitry as defined in claim 20, wherein $R_3$ is matched to $R_1$ and $R_2$.

22. A method of connecting/disconnecting a first and second circuitry points along a signal path, comprising the steps of:
   generating an electrical signal by an input means having an input node and characterized by an output resistance $R_2$, the input node being the first circuitry point;
   the signal to be received by an output means having the output node and characterized by an input resistance $R_3$, the output node being the second circuitry point;
   transmitting the signal through a switching means disposed between the first and second circuitry points, the switching means having a first state where the circuitry points are substantially electrically connected, and a second state where the circuitry points are substantially electrically disconnected, the switching means being responsive to a control signal generated by a control means having an output resistance $R_1$ wherein $R_1 >> R_2$ and $R_1 \geq R_3$, thus providing that voltage gain of the circuitry approaches unity and phase shift between output and input voltages approaches unity, thereby ensuring that connection and disconnection of the first and second circuitry points takes place without substantial signal degradation at high frequencies.

23. A method as defined in claim 22, wherein $R_1 >> R_3$.

24. A method as defined in claim 23, wherein $R_3 >> R_2$.

25. A method as defined in claim 22, suitable for operation with digital signals.

26. A method as defined in claim 22, suitable for operation with analog signals.

27. A method of controlling voltage gain and phase shift of a high frequency electrical signal passing through a switching circuitry, comprising the steps of:

generating an electrical signal by an input means having the input node and characterized by an output resistance $R_2$, the signal to be received by an output means having the output node and characterized by an input resistance $R_3$;

transmitting the signal through a switching means disposed between the input node and the output node along a signal path, the switching means having a first state where the nodes are substantially electrically connected, and a second state where the nodes are substantially electrically disconnected, the switching means being responsive to a control signal generated by a control means having an output resistance $R_1$, where $R_1 \geq R_3$;

varying the ratio of $R_2/R_1$ to provide predetermined signal characteristics at high frequencies, whereby the lower the ratio, the higher the voltage gain and the smaller the phase shift between the output and input voltages resulting in lower the deterioration of the signal.

28. A method as defined in claim 27, wherein $R_1 \gg R_3$.

29. A method as defined in claim 28, wherein $R_1 \gg R_2$.

\* \* \* \* \*